US006247853B1

(12) United States Patent
Papadopoulou et al.

(10) Patent No.: US 6,247,853 B1
(45) Date of Patent: Jun. 19, 2001

(54) INCREMENTAL METHOD FOR CRITICAL AREA AND CRITICAL REGION COMPUTATION OF VIA BLOCKS

(75) Inventors: Evanthia Papadopoulou, Elmsford; Mark Alan Lavin, Katonah; Gustavo Enrique Tellez, Cornwall on Hudson, all of NY (US); Archibald John Allen, Shelburne, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/085,093

(22) Filed: May 26, 1998

(51) Int. Cl.[7] ................................................. G06F 17/50
(52) U.S. Cl. ................................. 395/500.05; 395/500.2
(58) Field of Search ................................. 364/488, 489, 364/490, 491; 395/500.05, 500.06, 500.2

(56) References Cited

U.S. PATENT DOCUMENTS

| | | | |
|---|---|---|---|
| 3,751,647 | * | 8/1973 | Maeder et al. ................ 395/500.2 |
| 4,914,601 | * | 4/1990 | Smyth, Jr. ..................... 364/490 |
| 5,319,570 | * | 6/1994 | Davidson et al. .............. 364/488 |
| 5,438,527 | * | 8/1995 | Feldbaumer et al. .......... 395/500.2 |
| 5,544,256 | * | 8/1996 | Brecher et al. ................. 382/149 |
| 5,649,169 | * | 7/1997 | Berezin et al. ................ 395/500.44 |
| 5,754,432 | * | 5/1998 | Komatsuzaki et al. ......... 395/500.2 |
| 5,777,901 | * | 6/1998 | Berezin et al. ................ 395/500.2 |
| 5,841,893 | * | 11/1998 | Ishikawa et al. .............. 382/145 |

OTHER PUBLICATIONS

Wagner and Koren "An Interactive VLSI CAD Tool for Yield Estimation," IEEE Transactions on Semiconductor Manufacturing, vol. 8, No. 2, May 1995, p. 130–138.*
Dalal et al. "A Layout–Driven Yield Predictor and Fault Generator for VLSI," IEEE Transactions on Semiconductor Manufacturing, vol. 6, No. 1, Feb. 1993, p. 77–82.*
Stapper and Rosner "Integrated Circuit Yield Management and Yield Analysis: Development and Implementation," IEEE Transactions on Semiconductor Manufacturing, vol. 8, No. 2 May 1995, p. 95–102.*
Hess and Troele "Modeling of Real Defect Outlines and Parameter Extraction Using a Checkerboard Test Structure to Localize Defects," IEEE Transactions on Semiconductor Manufacturing, vol. 7, No. 3, Aug. 1994, p. 284–292.*

* cited by examiner

Primary Examiner—Kevin J. Teska
Assistant Examiner—Leigh Marie Garbowski
(74) Attorney, Agent, or Firm—McGuireWoods, LLP; Stephen C. Kaufman

(57) ABSTRACT

An efficient computer implemented method computes critical area for via blocks in Very Large Scale Integrated (VLSI) circuits. The method is incremental and takes advantage of the hierarchy in the design. In order to increase the efficiency further we use the $L_\infty$ or the $L_1$ metric instead of the Euclidean geometry.

14 Claims, 10 Drawing Sheets

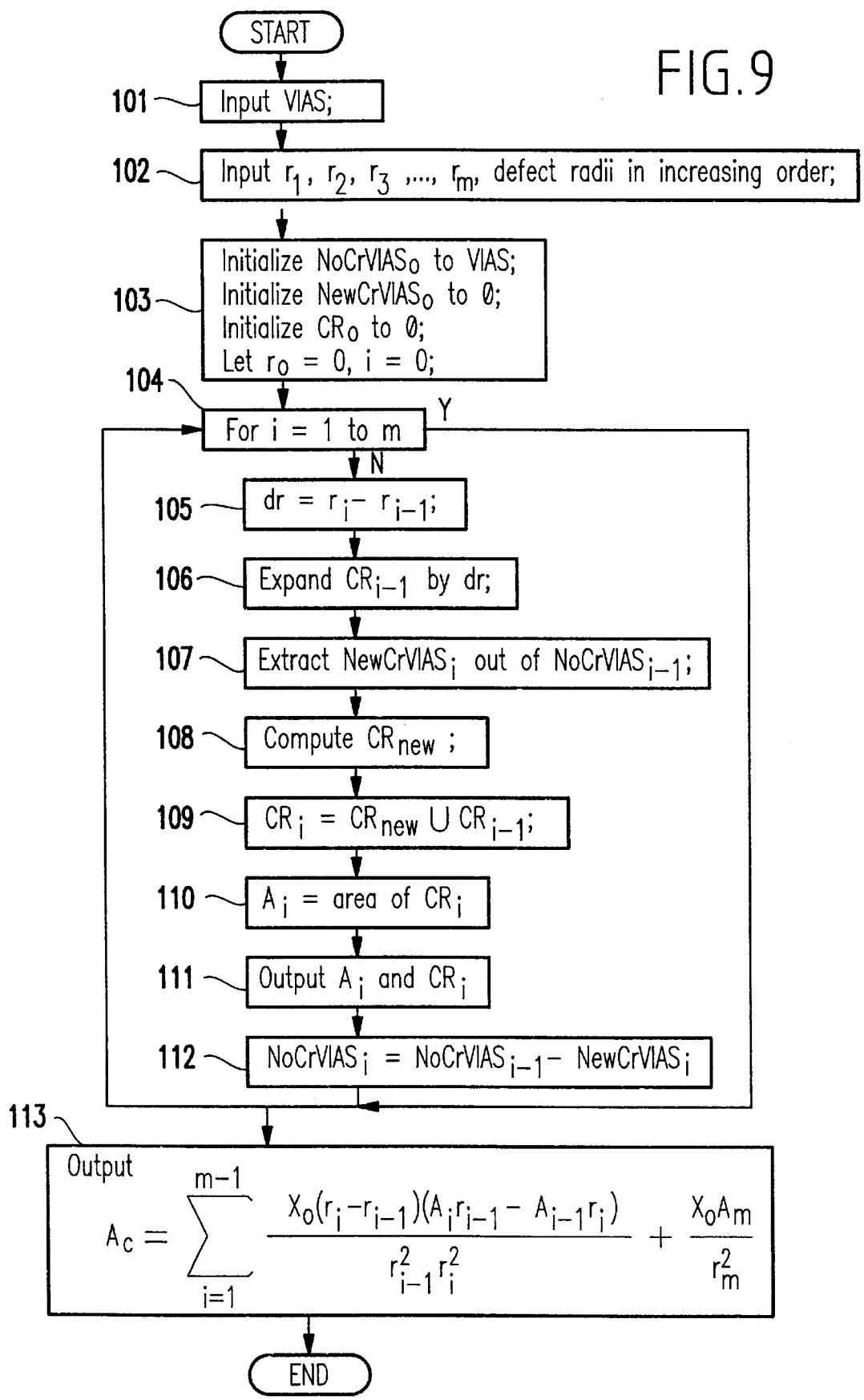

INCREMENTAL METHOD FOR CRITICAL AREA AND CRITICAL REGION COMPUTATION OF VIA BLOCKS

CROSS-REFERENCE TO RELATED APPLICATION

This application is related in subject matter to the disclosure of application Ser. No. 09/070,834 filed Apr. 30, 1998, for "Incremental Critical Area Computation for VLSI Yield Prediction" by M. Lavin and E. Papadopoulou, assigned to a common assignee and incorporated herein by reference.

DESCRIPTION

BACKGROUND OF THE INVENTION

1. Field of the Invention

The present invention generally relates to yield estimation techniques for large complex circuit designs and, more particularly, to an incremental method for critical area computation of via blocks in very large scale integrated (VLSI) circuits.

2. Background Description

Very large scale integrated (VLSI) circuit yield prediction is based on the concept of critical area which reflects the sensitivity of the chip to defects occurring during the manufacturing process. A via block is a missing material defect that overlaps with a via and thus destroys its connectivity. Via blocks occur frequently during fabrication and thus computing the critical area fast is an important problem in yield prediction.

PROBLEM SOLVED BY THIS INVENTION

Yield prediction is of growing importance in modern VLSI design due to the need for reducing the cost of manufacturing. Yield estimation techniques for large complex designs are based on the concept of critical area which provides an analytical formulation for yield loss caused by defects occurring during fabrication.

For examples of state of the art yield prediction techniques, see, W. Maly and J. Deszczka, "Yield Estimation Model for VLSI Artwork Evaluation", *Electron Lett.*, vol 19, no.6, pp. 226–22, March 1983, C. H. Stapper, "Modeling of Defects in Integrated Circuits Photolithographic Patterns", *IBM J. Research and Development*, vol.28, no.4, pp. 461–475, 1984, W. Maly, "Modeling of lithography related yield losses for CAD of VLSI circuits", *IEEE Transactions on Computer-Aided Design*, vol. CAD-4, no 3, pp. 166–177, July 1985, A. V. Ferris-Prabhu, "Modeling the Critical Area in Yield Forecast", *IEEE Journal of Solid State Circuits*, vol. SC-20, No. 4, August 1985, pp. 874–878, J. Pineda de Gyvez, C. Di, *IEEE Transactions on Computer-Aided Design*, vol.11, no 5, pp. 638–658, May 1992, I. A. Wagner and I. Koren, "An Interactive VLSI CAD Tool for Yield Estimation", *IEEE Transactions on Semiconductor Manufacturing*, Vol.8, No.2, 1995, pp. 130–138, and C. H. Stapper and R. S. Rosner, "Integrated Circuit Yield Management and Yield Analysis: Development and Implementation", *IEEE Transactions on Semiconductor Manufacturing*, Vol.8, No.2, 1995, pp. 95–101. Fabrication defects are caused by contaminants in materials and equipment. I. Bubel, W. Maly, T. Wass, P. Nag, H. Hartman, D. Schmitt-Landsiedel, S. Griep, "AFFCA: A Tool for Critical Area Analysis with Circular Defects and Lithography Deformed Layout", *IEEE International Workshop on Defect and Fault Tolerance in VLSI Systems*, November 1995, pp. 10–18, A. R. Datal, P. D. Franzon, M. J. Lorenzetti, "A layout-driven yield predictor and fault generator for VLSII", *IEEE Transactions on Semiconductor Manufacturing*, Vol.6, No.1, 1993, S. Gandemer, B. C. Tremintin, and J. J. Chariot, "Critical Area and critical levels calculation in IC yield modeling", *IEEE Transactions on Electronic Devices*, vol.35, no. 2, pp. 158–166, February 1988, W. Maly, "Computer Aided Design for VLSI Circuit Manufacturability", *Proc. IEEE*, Vol 78, No.2, February 1990, pp. 356–390, and H. Walker an S. W. Director, "VLASIC: A yield simulator for integrated circuits", *IEEE Transactions on Computer Aided Design*, vol. CAD-S, no. 4, pp. 541–556, October 1986.

From Wagner and Koren, supra, the formula used to compute critical area is the following:

$$A_c = \int_0^\infty \text{Area}(CR(r))D(r)dr \qquad (1)$$

where $A_c$ denotes the critical area, $CR(r)$ denotes the critical region, i.e., the region in which the center of a defect of size r must fall in order to cause circuit failure, and $D(r)$ is the density function of the defect size. $\text{Area}(CR(r))$ denotes the area of the critical region. Based on experimental data, $D(r)$ is given by the following formula:

$$D(r) = \begin{cases} \dfrac{cr^q}{r_0^{q+1}}, & 0 \le r \le r_0, \\ \dfrac{cr_0^{p-1}}{r^p}, & r_0 \le r \le \infty \end{cases}$$

where p, q are real numbers (typically p=3, q=1)

$$c = \frac{(q+1)(p-1)}{(q+p)}$$

and $r_0$ is some minimum optically resolvable size. See Stapper, supra, and A. V. Ferris-Prabhu, "Defect size variations and their effect on the critical area of VLSI devices", *IEEE Journal of Solid State Circuits*, vol. SC-20, No. 4, August 1985, pp. 878–880, and I. Koren, "The effect of scaling on the yield of VLSI circuits", *Yield Modeling and Defect Tolerance in VLSI Circuits*, W. R. Moore, W. Maly, and A. Strojwas Eds., Bristol UK: Adam-Hilger Ltd., 1988, pp. 91–99.

Essentially, there are two types of contamination causing manufacturing defects: extra material causing shorts between different conducting regions and missing material causing open circuits. Via blocks are missing material defects that overlap with vias and thus destroy the connection between elements of the same net in different layers. Among the missing material defects via blocks occur very frequently and thus computing their critical area is important for yield prediction.

SUMMARY OF THE INVENTION

It is therefore an object of the present invention to provide a new efficient method to compute critical area and critical regions for via blocks.

The method according to the invention is incremental and takes advantage of the hierarchy in the design. In order to increase the efficiency further, the $L_\infty$ or the $L_1$ metric is used instead of the Euclidean geometry. The present invention includes three major steps:

1. Model defects as "circles" in other than Euclidean geometries; e.g., the $L_\infty$ geometry. For example, the "unit circle" in the $L_\infty$ geometry is a square of side two. Modeling defects as squares instead of circles can make the computation easier and more efficient.
2. Characterize the critical region of a via shape for several geometries as a function of the defect size. In certain geometries (including the Euclidean), the critical region of one via shape grows uniformly as the defect radius increases.
3. Based on these characterizations, provide an incremental algorithm to compute critical area for via blocks which is valid for several geometries. The incremental computation is efficient because it takes advantage of the hierarchical structure typical of VLSI designs, in which repeated geometric patterns are represented by cells consisting of shapes and transforms on usages of those cells.

BRIEF DESCRIPTION OF THE DRAWINGS

The foregoing and other objects, aspects and advantages will be better understood from the following detailed description of a preferred embodiment of the invention with reference to the drawings, in which:

FIGS. 9 and 9A are flow charts showing the logic of the computer implemented process for determining critical area and critical region according to the invention.

DETAILED DESCRIPTION OF A PREFERRED EMBODIMENT OF THE INVENTION

This invention can be implemented on a general purpose workstation. Examples of a suitable platforms on which the invention may be implemented are disclosed in U.S. Pat. No. 5,528,508 to Phillip J. Russell and Glenwood S. Weinert for "System and Method for Verifying a Hierarchical Circuit Design", U.S. Pat. No. 5,519,628 to Phillip J. Russell and Glenwood S. Weinert for "System and Method for Formulating Subsets of A Hierarchical Circuit Design", and U.S. Pat. No. 5,481,473 to Young O. Kim, Phillip J. Russell and Glenwood S. Weinert for "System and Method for Building Interconnections in a Hierarchical Circuit Design".

Models for Defects and Vias

In the state of the art defect modeling techniques, defects are modeled, consistently, as circles. The underlying reason for modeling defects as circles is the common use of Euclidean geometry. The distance between two points, usually, is measured by the length of the line segment joining the two points. This is the Euclidean distance or the $L_2$ metric. The locus of points at unit distance from a center point is usually called the "unit circle". In Euclidean geometry, the "unit circle" is a circle of radius one.

In reality, defects need not be circular. In fact, they can have any kind of shape. Thus, as the inventors of the present invention have found, the use of other than the Euclidean geometries, although not normally used, may be used and simplify the computation of critical area.

Figure 1:
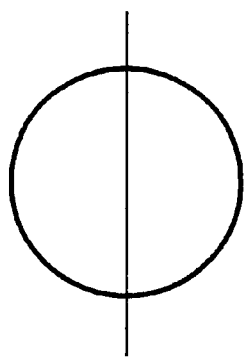
FIG. 1 is a diagram illustrating unit circles in $\lambda$-geometry.
Figure 1:
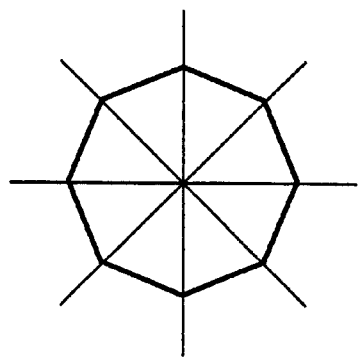
Figure 1:
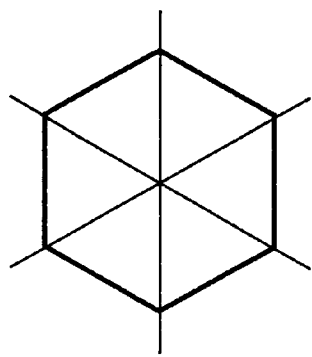
Figure 1:
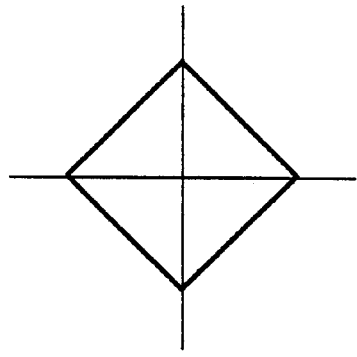

Therefore, according to the preferred embodiment of the present invention, critical area is computed in a non-Euclidian geometry, for example, in the $L_\infty$ metric, where the distance between two points $p=(x_p,y_p)$ and $q=(x_q,y_q)$ is $d(p,q)=\max\{|x_p-x_q|, |y_p-y_q|\}$. The "unit circle" in the $L_\infty$ metric is a square of side two. Alternatively, in the rectilinear geometry, i.e., the $L_1$ metric, the distance between two points $p=(x_p,y_p)$ and $q=(x_q,y_q)$ is $d(p,q)=|x_p-x_q|+\{y_p-y_q|$. The unit circle in $L_1$ metric is a square diamond with vertical and horizontal diagonals. In $L_1$ metric only the horizontal and vertical orientations are permitted. To fill the gap between the $L_1$ and the $L_2$ metric, the $\lambda$-geometry was introduced (see, for example, M. Sarrafzadeh and C. K. Wong, "An Introduction to VLSI Physical Design", Mc-Graw Hill Series in Computer Science, 1996). In $\lambda$-geometry, only orientations making angles in/$\lambda$ with the x-axis, for all i, are allowed. $\lambda$ is an integer where either $\lambda$ divides 360 or 360 divides $\lambda$, and $\lambda$>2. Distance between two points is measured using only the directions allowed. Note that the $L_1$ metric corresponds to the two-geometry and the Euclidean metric to the $\infty$-geometry. The "unit circle" in $\lambda$-geometry is a regular convex polygon with vertices on the allowed orientations at unit distance from the center. In 4-geometry for example, the unit circle is a regular octagon. FIG. 1 shows the unit circle for some values of $\lambda$. For more details on $\lambda$-geometry, see Sarrafzadeh and Wong, supra.

Since defects in reality can have any kinds of shape, it seems appropriate to use other geometries if the critical area computation can be simplified. Using the $L_\infty$, the $L_1$ or the 4-geometry corresponds to modeling defects as squares, diamonds or octagons, respectively. For practical purposes, a circular defect can certainly be approximated by a regular octagon. Yield estimation should not considerably depend on which of the above geometries is used to model defects as long as one geometry is chosen consistently. Therefore, the geometry used for a particular computation, preferably, should allow critical area computation in the most efficient way. The preferred embodiment method is applicable to all the above geometries (including the Euclidean case); however, the use of $L_\infty$ geometry can speed up the computation.

Figure 2B:
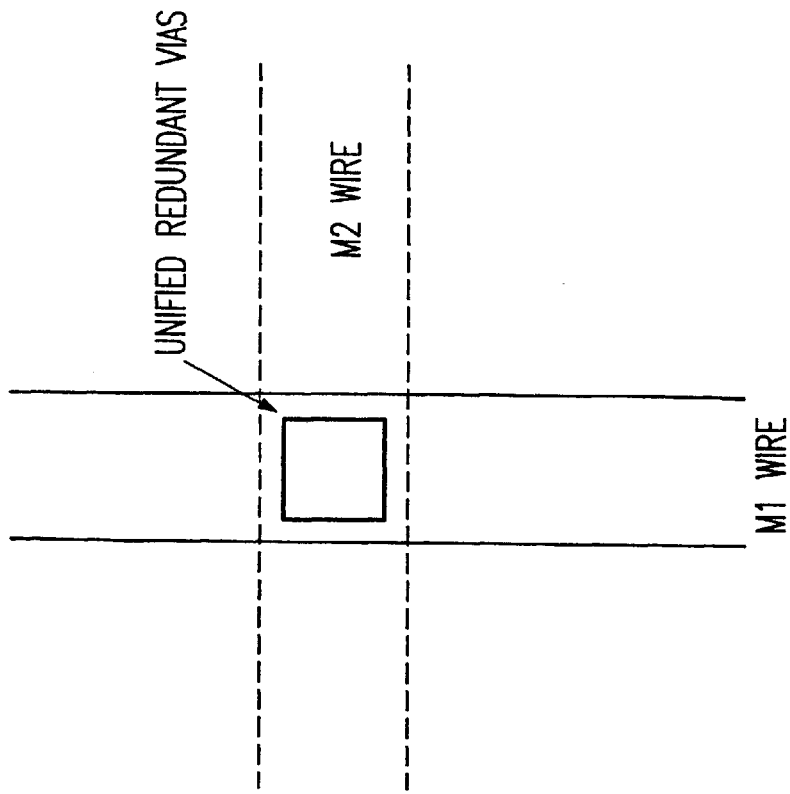
FIGS. 2A and 2B are diagrams illustrating respectively redundant vias and their grouping into a single via of larger size.
Figure 2A:
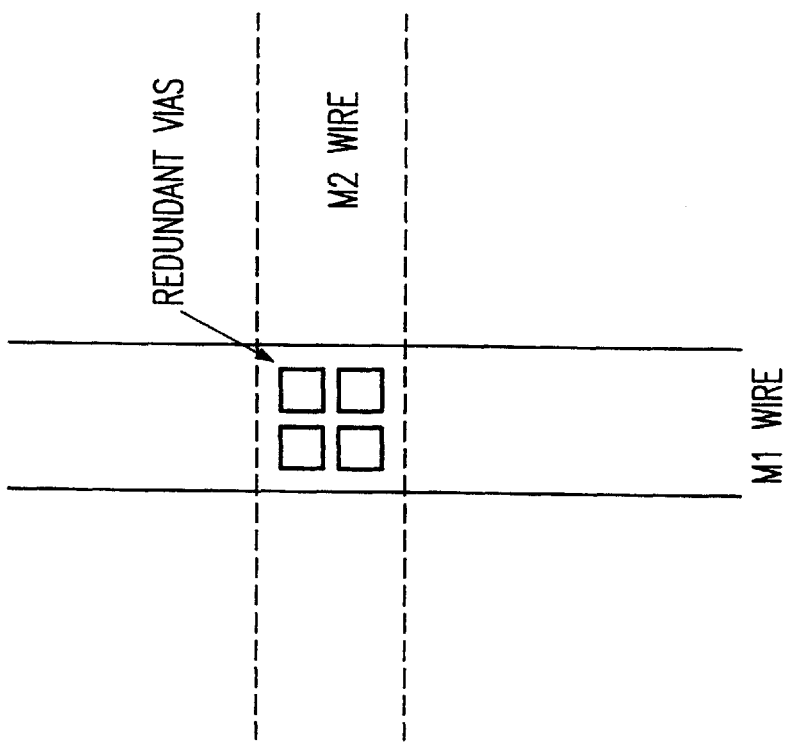

Vias between different layers are typically realized by square shapes. A defect is considered to be a block if it completely covers a whole via (B. R. Mandava, "Critical Area for Yield Models", IBM Technical Report TR22.2436, Jan. 12, 1982). To reduce the probability of missing contacts, designers often use redundant vias; i.e., they realize a contact through the use of a group of multiple vias that connect the same shapes. In this case, a defect is assumed to be a block if it completely covers all the redundant vias realizing the contact. Redundant vias are usually grouped together side by side, as shown in FIG. 2A; therefore, they may be regarded as a single via of larger size, as shown in FIG. 2B. Thus, in general, the contacts are rectilinear shapes of some determinate size. However, in existing designs, redundant vias are arranged into groups forming a larger square or rectangle and, therefore, one can safely assume that vias are rectangles of different sizes.

The preferred embodiment of the present invention, as described hereinbelow, is done after a via level has been preprocessed so that redundant vias have been unified into single shapes (see FIGS. 2A and 2B). This preprocessing operation can be done using a known shapes processing tool.

Characterizing Critical Regions

Let V be a rectilinear shape representing a contact at the via level. The critical region of V for a defect size r, denoted as CR(r), is the locus of points where, if the center of a defect falls, the defect covers the whole shape V. Each defect is modeled as a "circle" of radius r in one of the geometries mentioned above; i.e., $L_2$, $L_1$, $L_\infty$ or $\lambda$-geometry. Note that:

Lemma 1: A convex defect completely covers a via if and only if it covers all vertices on the convex hull of the via.
Proof: Since the defect is convex, any edge joining two vertices covered by the defect must be internal to the defect.

Based on the above observation, the following result may be shown for the critical region of a via V.

Theorem 1: The critical region of a via V for a defect size r is the common intersection of defects centered at all vertices of the convex hull of V.
Proof: Let $D_i$ be a defect of radius r centered at vertex $v_i$ of the convex hull of V. For any point x within $D_i$, the defect of radius r centered at x clearly covers vertex $v_i$. Thus, if a point x belongs to the common intersection of all defects centered at the vertices of the convex hull of V, the defect of radius r centered at x will cover all vertices of the convex hull. On the other hand if a point y, is not in $D_i$ for some vertex $v_i$ of the convex hull, then the defect of radius r centered at y cannot cover vertex $v_i$ and thus it is not a block of V.

In $L_\infty$, instead of a convex hull, considering the minimum enclosing rectangle of V:

Corollary A: In $L_\infty$, the critical region of a via v for a defect size r is the common intersection of four square defects of size r centered at the vertices of the minimum enclosing rectangle of V.

Figure 3:
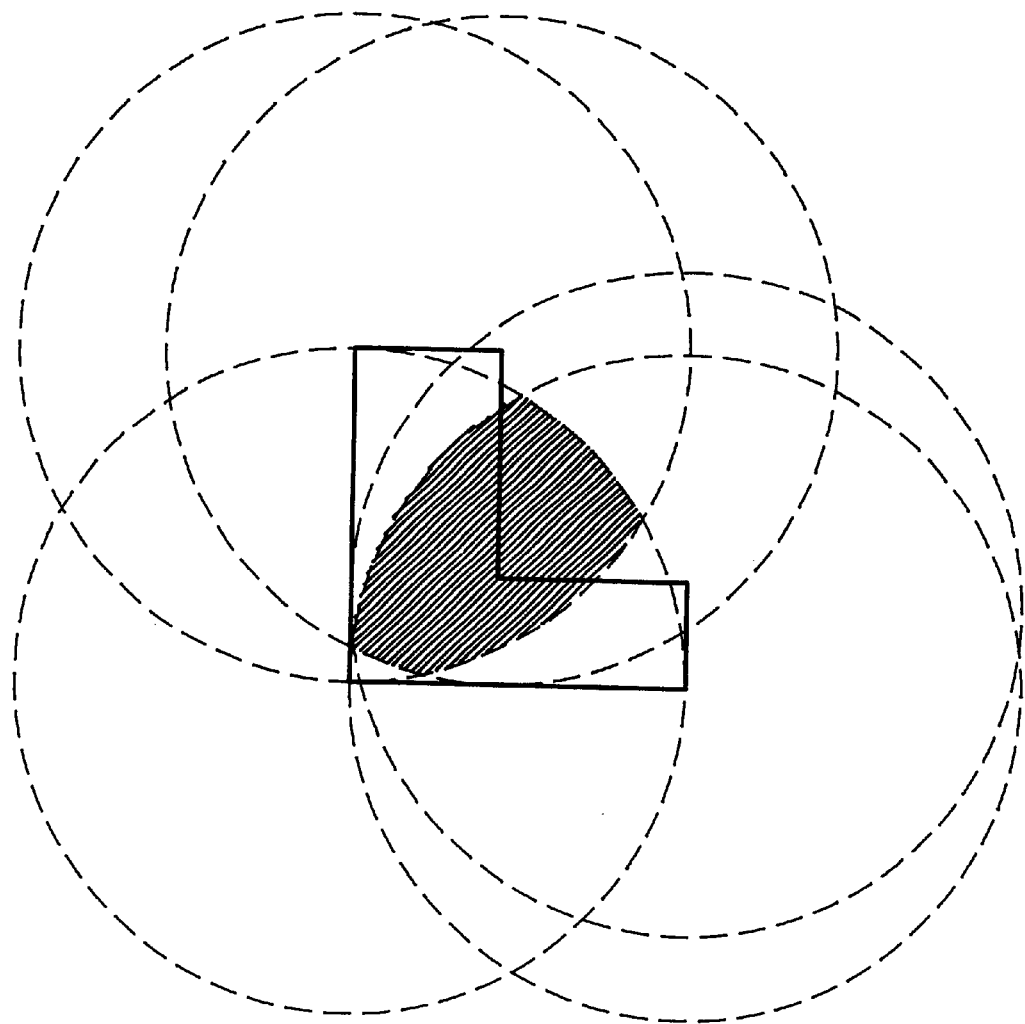
FIG. 3 is a diagram illustrating the critical region of an L-shaped via for circular defects.

By theorem 1, the boundary of the critical region for circular defects is a sequence of circular arcs each centered at a vertex of the convex hull of V (see FIG. 3). For large enough radius r, circular arcs produced by all vertices of the convex hull must appear on the boundary of the critical region. For a small radius, however, not all the convex hull vertices need to contribute a circular arc to the boundary of the critical region for all radii.

In Euclidean geometry (i.e., circular defects), the minimum defect that blocks the whole via is clearly the minimum enclosing circle of the convex hull. Thus, the minimal critical region is a single point at the center of the minimum enclosing circle. As the defect radius increases, the critical region gets transformed into a shape bounded by circular arcs. The exact shape of the critical region can be accurately determined using the farthest point Voronoi diagram of the via vertices. For information of farthest point Voronoi diagrams, see F. P. Preparata and M. I. Shamos, *Computational Geometry: an Introduction*, Springer-Verlag, New York, N.Y. 1985.

Although theoretically speaking contacts can be rectilinear shapes of any kind, in actual designs vias are typically grouped to form rectangular or square shapes; if not, they can still be approximated using the least enclosing rectangle. In fact, in $L_\infty$, the least enclosing rectangle is completely accurate (see Corollary A). Thus, the above observations for critical regions can be further simplified. Let V be a rectangular via and l,w denote the length and the width of V, respectively. The intersection point of the diagonals of V is the center of the via. The following observations can be easily derived from theorem 1.

Corollary 1: For circular defects, the critical region of a rectangular via V has the following properties:
The minimal critical region is the point P at the center of V. The defect radius giving rise to the minimal critical region is $$\hat{r}_0 = \frac{\sqrt{(l^2 + w^2)}}{2}.$$

Figure 4:
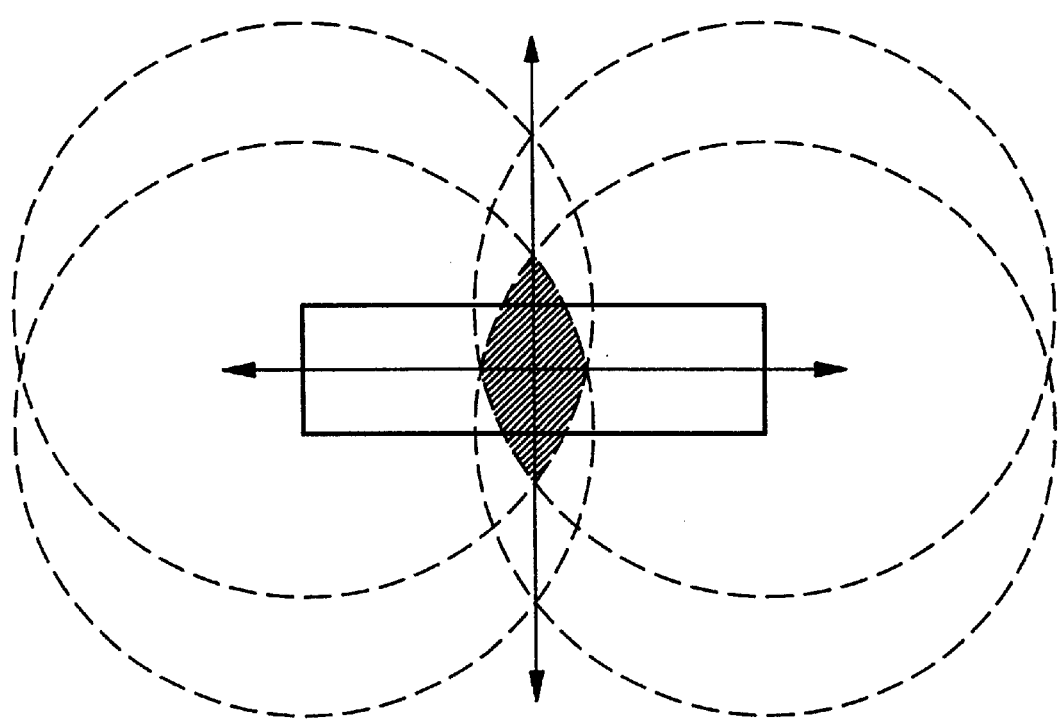
FIG. 4 is a diagram illustrating the critical region of a rectangular via for circular defects.

For any radius $r > \hat{r}_0$, the critical region is a circular diamond centered at P. The diagonals are on the vertical and horizontal axes through P (see FIG. 4). The boundary consists of four circular arcs each one belonging so the circle of radius r centered at each vertex of the via.
Corollary 2: In the $L_1$ metric (diamond-shaped defects), the critical region of a rectangular via V has the following properties:
The minimal critical region is the point P at the center of V. The defect radius giving rise to the minimal critical region of V $$\hat{r}_0 = \frac{(l + w)}{2}.$$

Figure 5:
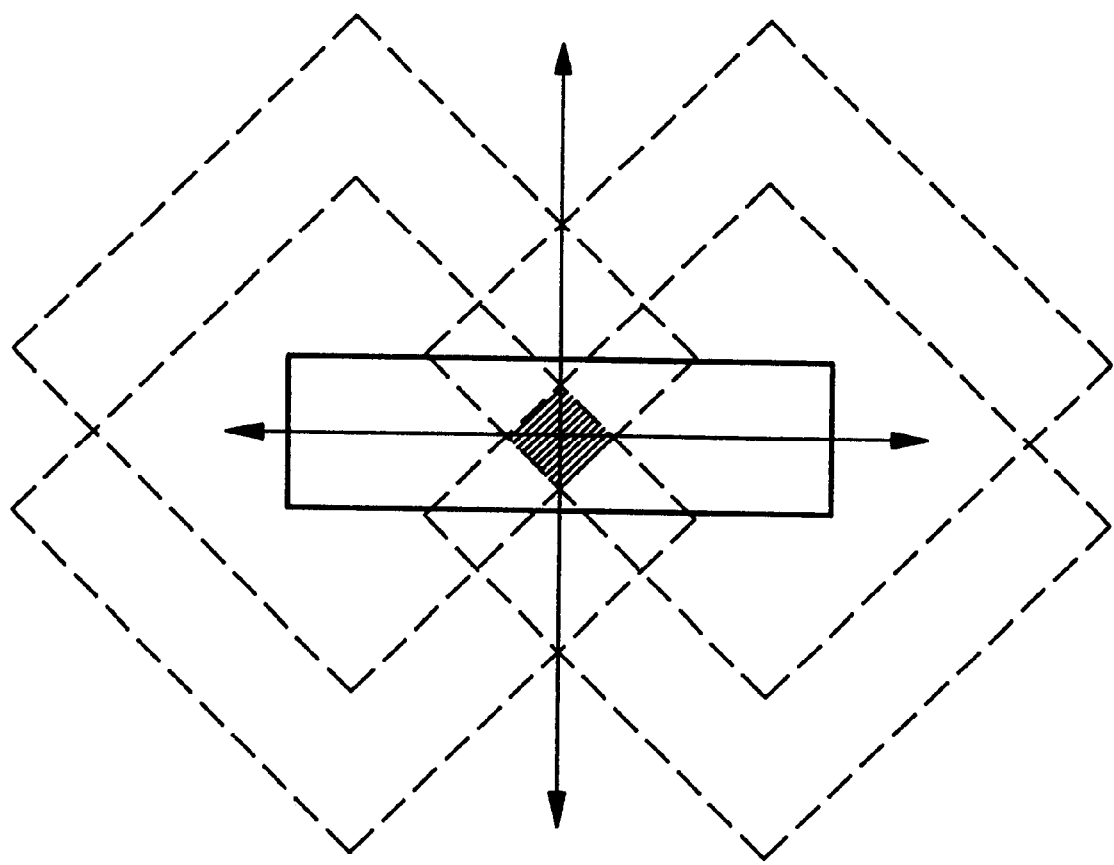
FIG. 5 is a diagram illustrating the critical region of a rectangular via in $L_1$ metric.
Figure 6:
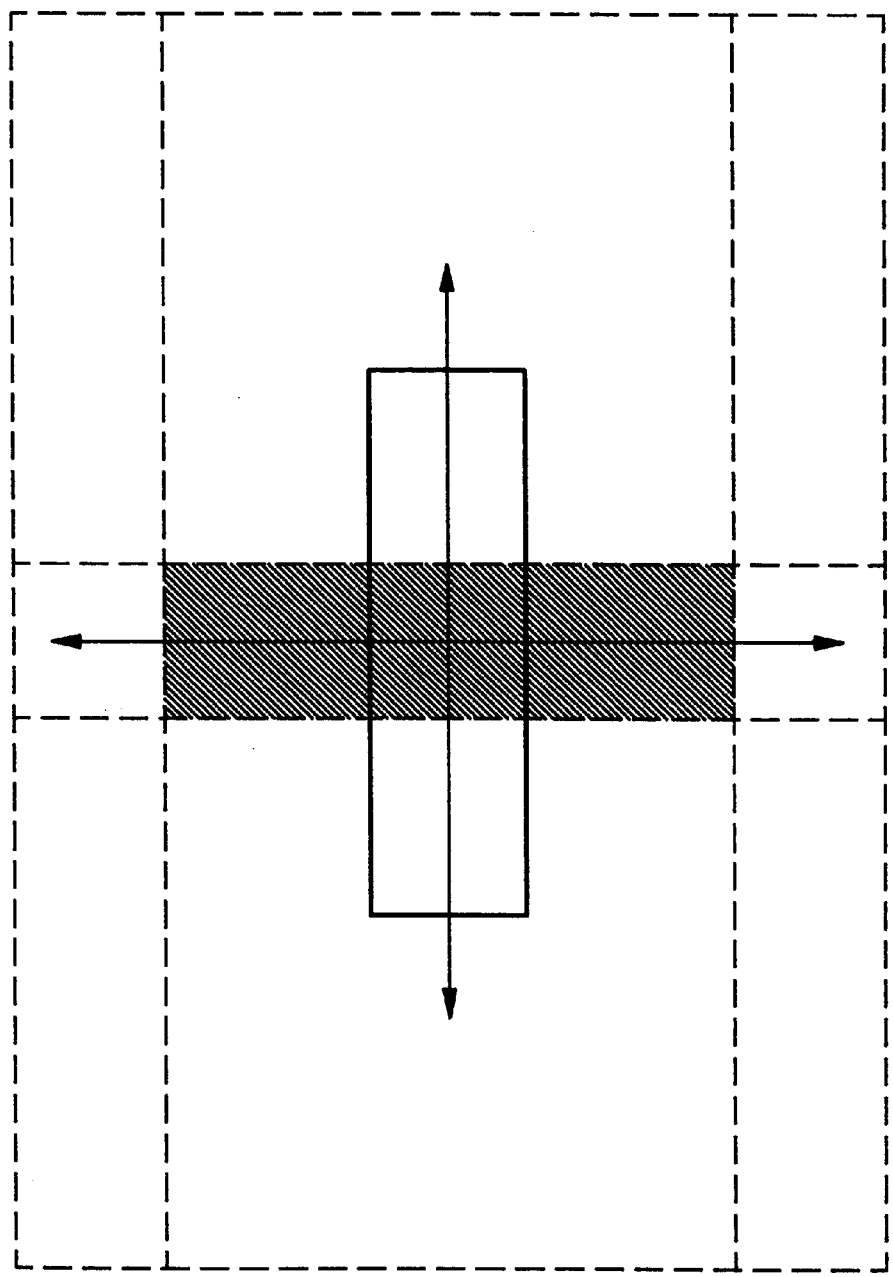
FIG. 6 is a diagram illustrating the critical region of a rectangular via for square defects.

For any radius $r > \hat{r}_0$, the critical region of V is a square diamond centered at P. The diagonals are vertical and horizontal and their length is 2(r−w) (see FIG. 5).
Corollary 3: For square defects, the critical region of a rectangular via V has the following properties:
The minimal critical region is a vertical or horizontal segment of length (l−w) passing through the point P at the center of V. (If V is square, the minimal critical region is the point P at the center of V). The defect radius giving rise to the minimal critical region of V is $\hat{r}_0 = l/2$.
For any radius $r > \hat{r}_0$, the critical region of V is a rectangle centered at P of size (2r−l)×(2r−w). See FIG. 6.
Proof: In the $L_\infty$ metric, i.e., for square defects, the critical region is the intersection of four squares of side 2r centered at the vertices of the via. Therefore, the critical region must be an isothetic rectangle. If the via is a square, the minimum critical region is the center of the via. In general, if the via is a rectangle, the minimum critical region is a vertical or horizontal line segment.

Clearly, in all the above metrics, the critical region grows uniformly as the defect radius increases. In other words, having computed $CR(r_1)$, $r_1 > \hat{r}_0$, $CR(r_2)$ can be derived for any radius $r_2 > r_1$ by simply expanding $CR(r_1)$ by $dr = r_2 - r_1$ in a uniform way. Thus, the following lemma:

Lemma 2: In $L_1$, $L_2$, $L_\infty$ metrics, the critical region of a rectangular via for defect radius $r_2 > \hat{r}_0$ can de derived from the critical region of any defect radius $r_1$, $\hat{r}_0 < r_1 < r_2$ by a uniform expansion of $dr=r_2-r_1$.

In the $\lambda$-geometry, $\lambda \neq 2, \infty$, lemma 2 is not exactly true. The reason is that now critical regions can take more than one shape. In particular, the critical region is the intersection of four ($2\lambda$)-gons placed at the vertices of a rectangle. Their common intersection need not always have $2\lambda$ vertices. Consider the case of $\lambda=4$, i.e., octagonal defects. The following can be easily derived by theorem 1.

Corollary 4: For octagonal defects, (4-defects) the critical region of a square via has the following properties:

The minimal critical region is point P at the center of V and appears for defect $$\hat{r}_0 = \frac{(l+w(\sqrt{2}-1))}{2}.$$

For a radius r between $\hat{r}_0$ and $$\hat{r}_1 = \frac{l}{\sqrt{2}},$$

the critical region is a diamond with diagonals centered at P with vertical and horizontal diagonals $d_1=2r-l-w(\sqrt{2}-1)$ and $$d_2 = \frac{(2r-w\sqrt{2})}{\sqrt{2}-1}.$$

Figure 7B:
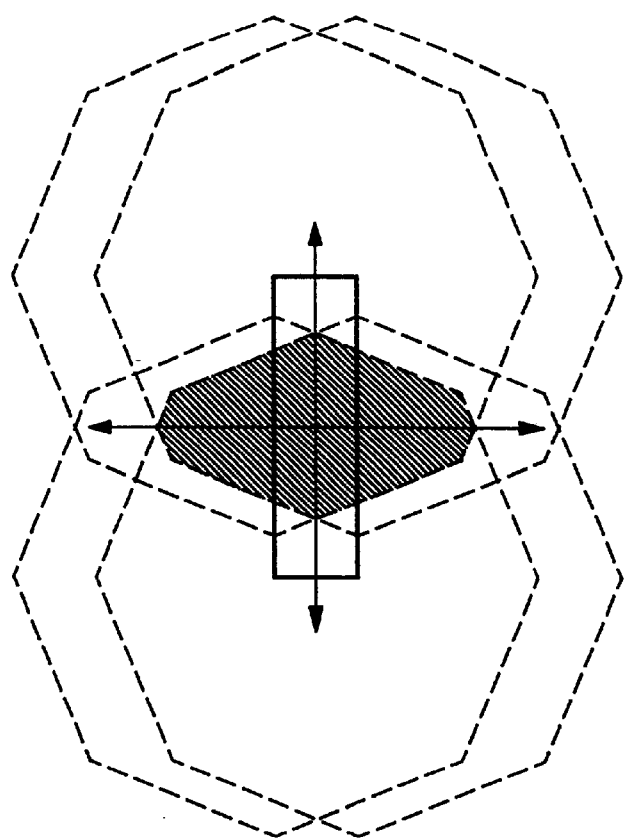
FIGS. 7A and 7B are diagrams illustrating the critical regions of a rectangular via for octagonal defects.
Figure 7A:
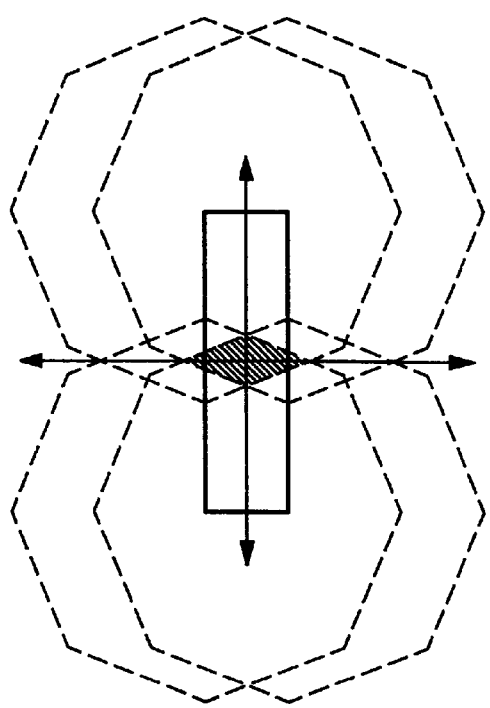

Diagonals $d_1$ and $d_2$ have the same direction as the width and the length of the via, respectively (see FIG. 7A).

For radius $r > \hat{r}_1$, the critical region is an octagon (not a regular one) centered at P, which is the result of intersecting the four defects centered at the vertices of the via. Note that the critical region is symmetric with respect to horizontal and vertical axes through the center of the via (see FIG. 7B).

By the above corollary, the critical region grows uniformly for any radius $r > \hat{r}_1$. It also grows uniformly for $\hat{r}_0 < r < \hat{r}_1$. For radius $\hat{r}_1$, however, four new vertices are added to the critical region shape. In other words discontinuity arises at $\hat{r}_1$.

Similar observations hold for other values of $\lambda$. However, as $\lambda$ increases, the number of discontinuities in the way the critical region grows also increases. Let $l_1, \ldots, l_\lambda$ denote the orientations allowed in $\lambda$-geometry in counterclockwise order where $l_1$ is the horizontal axis. Let $\delta(\lambda)$ denote the number of orientations allowed in $\lambda$-geometry within one quadrant (excluding the vertical axis); e.g., $\delta(2)=1$, $\delta(3)=2$, $\delta(4)=2$. Let X and Y denote the, horizontal and vertical axes through the center of the via P. Clearly X and Y are axes of symmetry in the critical region for any radius and any $\lambda$. Thus, it is enough to concentrate within one of the quadrants defined by X and Y. The critical region within a quadrant is given by the defect centered at the farthest via vertex; i.e., the vertex within the opposite quadrant.

Concentrate on the first quadrant where the critical region is given by the defect centered at vertex $v_1$, the SW vertex of the via, and assume without loss of generality that the length of the via appears on the horizontal axis. Clearly, the minimum critical region occurs for $\hat{r}_0 = d_\lambda(v_1, P)$, where $d_\lambda(v_1, P)$ is the distance from $v_1$ to P in $\lambda$-geometry. In that case, the critical region is the point P at the center of the via. Unless the diagonal of the via lies on some orientation $l_i$, the critical region will start as a diamond immediately after $\hat{r}_0$. Every time r becomes large enough to allow the intersection of an orientation $l_i$ with axis Y a new vertex is added in the first quadrant of the critical region (i.e., four vertices are added to the critical region shape). Once the last orientation $l_i$ within one quadrant emanating from $v_1$ intersects Y at distance r from $v_1$, the critical region takes its final shape and grows uniformly thereafter. The final shape of the critical region is a $4\delta(\lambda)$-gon produced by the intersection of the four defects centered at the vertices of the via. Using these observations, exact formulas for any specific $\lambda$ can be derived.

Figure 8:
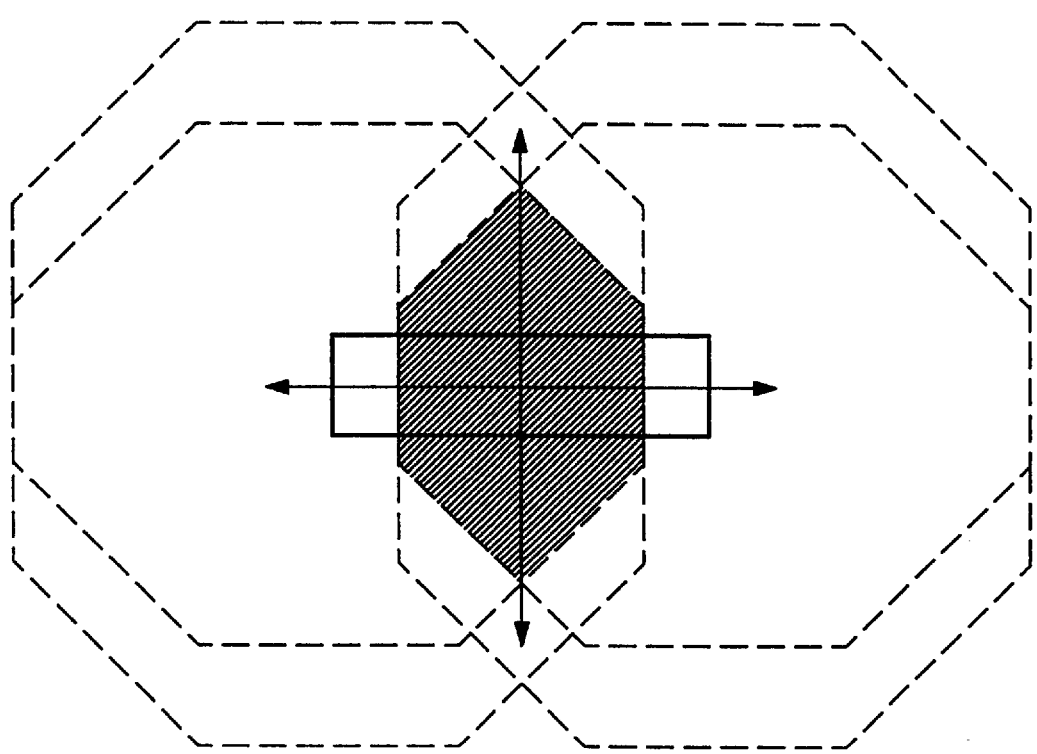
FIG. 8 is a diagram illustrating the critical region for octagonal defects rotated by 22.5°.

For practical considerations, it would be convenient to use geometries where critical regions are ortho-45 shapes. For existing software, such as Niagara, shape manipulation for ortho-45 shapes is much more efficient than general shapes manipulation. Rotating the 4-geometry by 22.5°, the unit circle becomes an ortho-45 regular octagon. Then, the critical region produced by such a defect must also be an ortho-45 shape (see FIG. 8). In this case, one or two discontinuities occur in the way the critical region grows depending on where the center of the via P lies with respect to the orientations. The defect radius that gives rise to the minimal critical region as well as the defect radius after which the critical region expands uniformly are not hard to derive similarly to $\lambda$-goemetry. Summarizing:

Lemma 3: In the rotated 4-geometry counterclockwise by $\pi/8$, the minimal critical region appears for radius $$\hat{r}_0 = \sqrt{(l+m_1^2)} \left( \max\left\{ \frac{1}{2}, \frac{(l+w)}{[2(1+m_1)]} \right\} \right)$$

where $m_1 = \tan\pi/8$. For radius $$r > \hat{r}_1 = \frac{1}{2}\sqrt{(1+m_2^2)},$$

$m_2 = \tan 3\pi/8$, the critical region is an ortho-45 octagonal shape. (Note that $m_1 = 1/m_2$.) As r increases above $\hat{r}_0$, the critical region expands uniformly.

Given a defect radius r, the area of the critical region can be computed using theorem 1. Given any via shape and any defect size r, the critical region shape can be computed by placing defects at vertices of the via and computing their common intersection. If vias are rectangles, the critical region can be produced by using the formulas of the previous section. To compute the total area of the critical regions for all vias, the union of all the critical region shapes can be computed and the area of the resulting shapes found.

For the preferred embodiment method, the goal is to compute the critical area provided in equation (1). Thus, for the preferred embodiment, discrete values are computed for equation (1) for list of retrieved defect radii R. Thus, for every distinct retrieved radius $r_i \in R$, the area of the critical region, $A(r_i)$, is computed.

However, for rectangular vias there is no need to repeat the process form scratch at each step. The observation is that critical regions in $L_1$, $L_2$ and $L_\infty$ metrics grow uniformly for each via. Moreover, in $\lambda$-geometry there is a change in the way the critical region of a via grows only at $\delta(\lambda)$ radii where $\delta(\lambda)$ is the number of orientations allowed in λ-geometry within one quadrant. Thus, hereinafter, the $L_1$, $L_2$ or $L_\infty$ metric are used, i.e., defects are assumed square diamonds, circles or squares, respectively.

Let $CR_i$ denote the collection of critical region shapes for $r_1$. After all overlapping critical regions have been unified into single shapes. $CR_i$ consists of disjoint shapes that may contain holes.

For the next radius $r_{i+1}$, there are two kinds of critical regions: 1) Critical regions of vias that have already contributed in $CR_i$. 2) New critical regions of vias whose minimal radius is between $r_i$ and $r_{i+1}$. In the former case the critical region is expanded by $dr=r_{i+1}-r_i$. In the latter case, new critical regions appear. $CR_{i+1}$ can be computed incrementally as follows:

(a) Expand $CR_i$ by $dr=r_{i+1}-r_i$.
(b) Compute $CR_{new}$, the collection of critical regions of vias whose minimal radius is between $r_i$ and $r_{i+1}$.
(c) Union $CR_{new}$ and the expanded $CR_i$; let the result be $CR_{i+1}$.
(d) Compute the area of $CR_{i+1}$.

Figure 9A:
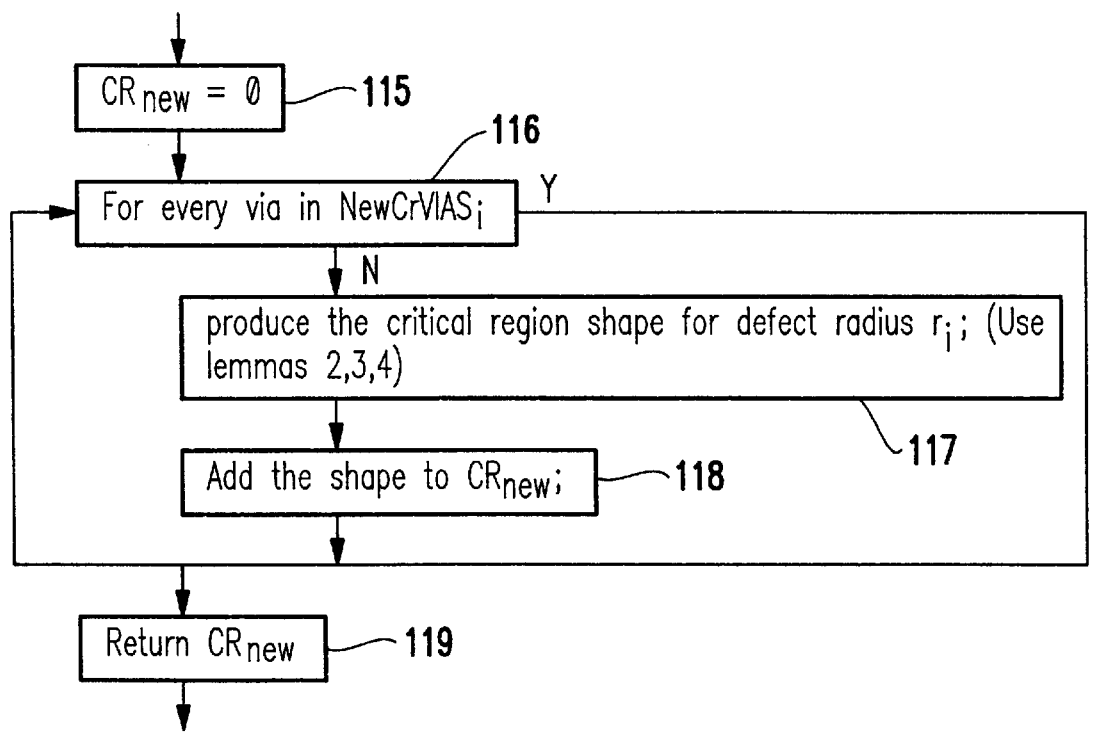

A flow chart of the computer implemented process which incorporates this algorithm is shown in FIG. 9. The process begins by inputting the vias in function block 101 and inputting the defect radii $r_1, r_2, r_3, \ldots, r_m$ in increasing order in function block 102. Then, in function block 103 an initialization step is executed before entering a processing loop. In this initializing step, $NoCrVIAS_0$ is set to VIAS, $NewCrVIAS_0$ is set to zero, $CR_0$ is set to zero and $r_0$ and i are both set to zero. Here, VIAS is the set of vias that have been processed so that redundant vias are substituted by their minimum enclosing rectangle; $CR_i$ is the total critical region of defect size $r \leq r_i$; $NoCrVIAS_i$ is the collection of vias that cannot be blocked by any defect of size $r<r_i$ (note that vias in $NoCrVIAS_i$ have not contributed critical region to $CR_i$); $NewCrVIAS_i$ is the collection of vias such that the defect radius giving rise to the minimal critical region is between $r_{i-1}$ and $r_i$ (note that $NewCrVIAS_i \subset NoCrVIAS_{i-1}$); and $CR_{new}$ is the collection of critical region shapes produced by vias in $NewCrVIAS_i$.

The processing loop is controlled by decision block 104 which determines whether i=m, indicating that all defect radii have been processed, i.e., m is the number of discrete defect radii. If i<m, dr is set to $r_i-r_{i-1}$ in function block 105, and $CR_{i-1}$ is expanded by dr in function block 106. Expanding shapes is an operation supported by the systems disclosed, for example, in U.S. Pat. Nos. 5,528,508, 5,519,628 and 5,481,473. The $NewCrVIAS_i$ is extracted out of $NoCrVIAS_{i-1}$ in function block 107 using the formulas of corollaries 1, 2 and 3. Then $CR_{new}$ is computed in function block 108.

So, for corollary 3, for example, for every via in $NoCrVIAS_{i-1}$, such that $1<2r_i$ (where 1 is the length of via), a rectangle of size $(2r_i-1) \times (2r_i-w)$ is produced and put in $NewCrVIAS_i$. For diamond shaped defects in corollary 2, for example, for every via in $NoCrVIAS_{i-1}$, such that $1+w<r_i$, a square diamond of diagonals $2(r_i-w)$ is produced and put in $NewCrVIAS_i$. For circular shaped defects in corollary 1, for example, for every via in $NoCrVIAS_{i-1}$, such that $1^2+w^2<4r_i^2$, a circular diamond is produced and put in $NewCrVIAS_i$. This process is shown in more detail in the flow chart of FIG. 9A to which reference is now made.

Initially, $CR_{new}$ is set to zero in function block 115 before entering the processing loop controlled by decision block 116. The process is performed for every via in $NewCrVIAS_i$. First, the critical shape for defect radius $r_i$ is produced using corollaries 1, 2 and 3 in function block 117. Then, the shape is added to $CR_{new}$ in function block 119. When all vias in $NewCrVIAS_i$ are processed, a return of the computed $CR_{new}$ is made in function block 120.

Returning now to FIG. 9, $CR_i$ is set to equal the union of $CR_{new}$ and $CR_i-1$ in function block 109. Again, the union of shapes is an operation readily available in the systems disclosed, for example, in U.S. Pat. Nos. 5,528,508, 5,519,628 and 5,481,473. Note that $CR_{i-1}$ has been expanded by dr in a previous step. The area $A_i$ is set to equal $CR_i$ in function block 110, and both $A_i$ and $CR_i$ are output in function block 111. Finally, $NoCrVIAS_i$ is set to $NoCrVIAS_{i-1}-NewCrVIAS_i$ in function block 112 before looping back to decision block 104. This processing loop continues until i=m, at which point the accumulated output $A_c$ is output in function block 113. The formula used, $$A_c = \sum_{i=1}^{m-1} \frac{X_0(r_i - R_{i-1})(A_i r_{i-1} - A_{i-1} r_i)}{r_{i-1}^2 r_i^2} + \frac{X_0 A_m}{r_m^2},$$

is derived by approximating equation (1) at defect radii $r_1, \ldots, r_k$. The defect distribution is assumed to be $$D(r) = \frac{X_0}{r^3}.$$

In λ-geometry, $\lambda \approx 1, \infty$, critical regions for rectangular vias do not grow completely uniformly. The critical region shape changes at $\delta(\lambda)$ values. Within these $\delta(\lambda)$ intervals, however, the critical regions do grow uniformly. Consider the case of $\lambda=4$; i.e., the case of octagonal defects. Similar results can be derived for other values of λ. In practice, octagonal defects are close enough to circles. Thus, the 4-geometry is a very close alternative to Euclidean geometry for critical area estimation. For this reason, the details for any other λ are not discussed herein.

Let $CR_i$ denote the unified collection of critical regions forming octagonal shapes for radius $r_i$. No diamond shaped critical region is included in $CR_i$. Let $CRd_i$ denote the collection of diamond shaped critical regions without being unified; i.e., overlapping diamond shapes are considered as different shapes in $CRd_i$. Thus, three kinds of critical regions for the next radius $r_{i+1}$ have been identified.

Critical regions of vias that have already contributed in $CR_i$. These critical regions simply get expanded by $dr=r_{i+1}-r_i$ New octagonal critical regions for vias such that $r_{i+1}>\hat{r}_1$. Some of these vias may have already contributed diamond critical regions for $r_i$. Note that square vias do not produce diamond critical regions.

Diamond critical regions for vias such that $\hat{r}_0<r_{i+1}<\hat{r}_1$. Some of this vias may have already produced critical regions for $r_i$.

The area of critical regions for $r_{i+1}$ can be computed as follows:

(a) Expand $CR_i$ by $dr=r_{i+1}-r_i$.
(b) For those vias with $r_{i+1}>\hat{r}_1 \geq r_i$, compute the collection of new octagonal critical regions, $CR_{new}$.
(c) For those non-square vias with $\hat{r}_0 \leq r_{i+1}<\hat{r}_1$, compute the collection of diamond critical regions, $CRd_{i+1}$.
(d) Union $CR_{new}$ and the expanded $CR_i$; let the result be $CR_{i+1}$.
(e) Temporarily union $CR_{i+1}$ and $CRd_{i+1}$ and compute the area of the unioned shapes.

Because critical regions of non-square vias do not take their final shape until $\hat{r}_2$, the expansion procedure cannot start when a via produces critical region. However, the size of diamond critical regions is small compared to the size of the via and, thus, there is little overlap among diamond critical regions. Therefore, 4-geometry is slightly less efficiency compared to $L_1$ or $L_\infty$ metric.

Another inefficiency is that critical regions have in general eight edges instead of four. This implies that the boundary of $CR_i$ has larger size. Moreover, in general critical region shapes are not ortho-45. To avoid this latter inefficiency, one could use the 22.5° 4-geometry where critical regions are indeed ortho-45 shapes. In practice, expansion and area computation can be done efficiently for orthogonal or ortho-45 shapes.

In the Euclidean metric, the inefficiency stems out of the fact that the boundary of critical regions consists of circular arcs. To implement this incremental method for circular defects, one must be able to do expansions of circular arcs as well as computing area bounded by circular arcs. Although these operations are certainly doable, in practice they are less efficient than manipulating shapes consisting of straight lines.

Due to the above reasons, in practice, the most efficient computation of critical area for blocks can be achieved in the $L_1$ and $L_\infty$ metric. Note that in $L_\infty$ metric, critical regions are orthogonal shapes, while in $L_1$ metric, their boundary consists only of 45° and 135° edges. Expansions and area computation in these cases can be done very efficiently in practice. Another fact worth noticing is that the $L_1$ critical region of a via is totally contained within the $L_2$ critical region, and the $L_2$ critical region is totally contained within the $L_\infty$ critical region. Thus, the $L_\infty$ critical area and the $L_1$ critical area are upper and lower bounds, respectively, of the $L_2$ critical area.

Taking Advantage of the Hierarchy

The incremental computation of critical regions indirectly takes advantage of the hierarchy in hierarchical designs. A layout is usually given in a hierarchical form which is usually represented by a directed acyclic graph. For a small defect size r, critical regions of vias in different cells are more or less disjoint. Thus, for small radii, the area of critical regions is computed without any considerable flattening of the layout. As the radius increases, overlaps between critical regions in different cells start to arise. Such overlaps correspond to flattening because overlapping shapes in different cells are being unioned.

However, as more and more shapes are unioned, the number of flat distinct shapes decreases. Moreover, as unioned shapes are expanded their contour becomes simpler. Thus, as the design is flattened (unnested), the number of shapes increases; but, simultaneously, the number of design shapes decreases because of they are unioned together. This trade-off reduces deterioration that might otherwise occur in the method as the defect radius increases. For large defect radius, the number of distinct critical region shapes is small, and thus the area can be computed efficiently despite the defect's large size. Experimental results with the above method show that the computation of critical regions is more time consuming for medium sized defect radii.

Partial Blocks

It may be desirable to compute critical area for defects that partially overlap a via sufficiently to destroy its functionality, although it is not completely destroyed. The prevailing definition of a partial block is a defect that covers at least X % of the via area. This definition makes critical area computation for partial blocks more difficult than ordinary blocks. Moreover, the definition is not very accurate for redundant vias.

For example, a rectangular via shape V may consist of four redundant vias arranged linearly. A defect covering 60% of V may partially cover all four vias, partially blocking V. However, it may also partially cover three vias, leaving one of the vias completely uncovered. In the latter case the defect should not be considered as a partial block although it covers 60% of the area of V.

For the preferred embodiment, an alternate definition is provided that allows treating partial blocks in the same way as blocks. Although the critical regions are different for the two definitions, they should both give similar indication for the purpose of yield estimation.

Given a single via S (a single via is always a square), let the p % core of the via be a square centered at the same point as S covering p % of the area of S. The core of S can clearly be derived by shrinking S by q % where g=100−p. To shrink a square via, every edge e must be displaced by q e.

Definition: A defect is considered a p % partial block of S if it completely covers the p % core of S.

For a group of redundant vias, a defect is a partial block if it is a partial block for every via in the group. Then according to the above definition, a defect is regarded a partial block of a group of redundant vias if and only if it completely covers the core of all vias in the group. Thus, if all cores are unified into a single shape C, then that a defect may be treated as a partial block for the group of vias if it completely covers C. Using this definition, partial blocks may be treated in the same way as blocks. To implement this, vias must be shrink by q % at the beginning of preprocessing.

Figure 10:
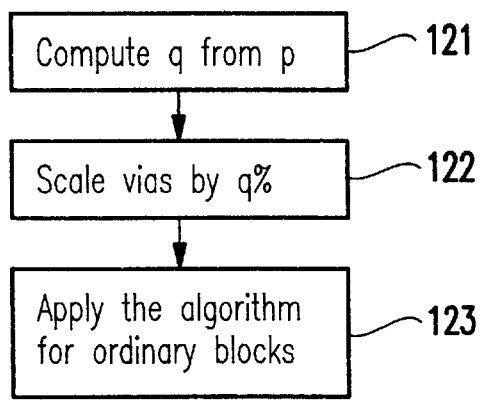
FIG. 10 is a flow chart showing the logic of the computer implemented process for determining partial blocks according to the invention.

The flow chart of the process for determining partial blocks is shown in FIG. 10. In function block 121, q is computed from p. The vias are scaled by q % in function block 122. Finally, the process for ordinary blocks (see FIG. 9) is applied in function block 123.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A computer implemented method for critical area computation of via blocks in VLSI circuits comprising the steps of:
   a) retrieving a design layer containing a plurality of via shapes;
   b) retrieving a list of defect sizes ordered in increasing size;
   c) identifying all of said vias as critical vias or as non-critical vias, critical vias being smaller than a size determined by a minimum defect size;
   d) generating critical region for said critical vias;
   e) identifying all vias from said non-critical vias being smaller than a size determined by a next smallest defect size as critical vias;
   f) generating critical region for each said identified critical vias; and g) repeating steps (d) and (e) for each defect size in said list.

2. The computer implemented method of claim 1 wherein the step (f) of generating the critical region comprises:
 1) expanding said critical region by the difference between a radius of each said defect and the next smallest defect size; and
 2) introducing new critical regions for those critical vias identified in step (e).

3. The computer implemented method of claim 2 wherein the step (a) of retrieving a design layer further comprises replacing redundant vias with a minimum enclosing rectangle.

4. The computer implemented method of claim 2 wherein the step (f) of generating critical regions for critical vias having a critical radius $r_i$ comprises the following steps:
 1) Expanding the critical region $CR_{i-1}$ by $dr=r_i-r_{i-1}$;
 2) Computing for those vias with a critical radius between $r_i$ and $r_{i-1}$, a collection of new polygonal critical regions, $CR_{new}$;
 3) Unioning $CR_{new}$ and the expanded critical region $CR_{i-1}$ as $Cr_i$; and
 4) computing the area of $CR_i$.

5. The computer implemented method of claim 4 wherein the defects are assumed to be square.

6. The computer implemented method of claim 4 wherein the defects are assumed to be circular.

7. The computer implemented method of claim 4 wherein the defects are assumed to be square diamond shaped.

8. The computer implemented method of claim 2 wherein the step (f) of generating critical regions for critical vias having a critical radius $r_i$ comprises the following steps:
 1) Expanding the critical region $CR_{i-1}$ by $dr=r_i-r_{i-1}$;
 2) Computing for those vias with $r_{i+1}>\hat{r}_i$, a collection of new polygonal critical regions, $CR_{new}$;
 3) Computing for non-square vias with $\hat{r}_0 \leq r_i < \hat{r}_1$, a collection of polygonal critical regions, $CRd_i$;
 4) Unioning $CR_{new}$ and the expanded critical region $CR_{i-1}$ as $Cr_i$; and
 5) Unioning $CR_i$ and $CRd_i$ and computing therefrom an area of the unioned shapes.

9. The computer implemented method of claim 8 wherein the defects are assumed to be octagonal shaped.

10. A method of integrated circuit chip design including checking a chip design according to the computer implemented method of claim 1 and further comprising the step of:
 h) modifying a design layer of said checked chip design based on said generated actual critical region to improve manufacturing yield; and
 i) rechecking said chip design using said computer implemented method.

11. A method of integrated circuit chip design according to claim 10 further comprising repeating steps (h) and (i) until a desired predicted yield is achieved.

12. A system for analyzing defect critical areas of integrated circuit chips, said system comprising:
 means for storing a plurality of design shapes on a design layer;
 means for determining critical regions for said stored design shapes;
 means for organizing said determined critical regions according to a critical radius; and
 means for generating an actual critical region for each remaining said seed critical region.

13. A system for analyzing defect critical areas integrated circuit chips as in claim 12, further comprising means for expanding identified critical regions according to the difference between a critical radius of said identified critical region and the radius of said minimum defect size.

14. A system for analyzing defect critical areas integrated circuit chips as in claim 12, further comprising means for determining a least critical shape.

* * * * *